United States Patent
Suzuki

(10) Patent No.: US 10,121,979 B2
(45) Date of Patent: Nov. 6, 2018

(54) DISPLAY DEVICE

(71) Applicant: Japan Display Inc., Minato-ku (JP)

(72) Inventor: Takayasu Suzuki, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/788,859

(22) Filed: Oct. 20, 2017

(65) Prior Publication Data

US 2018/0123061 A1 May 3, 2018

(30) Foreign Application Priority Data

Oct. 31, 2016 (JP) .................. 2016-213476

(51) Int. Cl.
*H01L 29/18* (2006.01)
*H01L 51/00* (2006.01)
*H01L 51/52* (2006.01)
*H01L 27/32* (2006.01)

(52) U.S. Cl.
CPC ...... *H01L 51/0097* (2013.01); *H01L 51/5256* (2013.01); *H01L 27/3244* (2013.01); *H01L 2251/5338* (2013.01)

(58) Field of Classification Search
CPC ......... H01L 51/0097; H01L 2251/5338; H01L 51/5253; H01L 27/3276; H01L 27/323; H01L 27/3244; H01L 51/5246; H01L 27/3248; H01L 27/3262; H01L 51/524; H01L 51/5012; H01L 2227/323; H01L 51/5237
See application file for complete search history.

(56) References Cited

U.S. PATENT DOCUMENTS

| | | | |
|---|---|---|---|
| 2004/0065894 A1* | 4/2004 | Hashimoto | H01L 33/642 257/100 |
| 2011/0260180 A1 | 10/2011 | Kuranaga et al. | |
| 2013/0181204 A1 | 7/2013 | Kuranaga et al. | |
| 2015/0314561 A1* | 11/2015 | Kim | B32B 37/1292 428/201 |
| 2017/0062742 A1* | 3/2017 | Kim | H01L 51/0097 |

FOREIGN PATENT DOCUMENTS

JP 2011-227369 11/2011

* cited by examiner

*Primary Examiner* — Robert Bachner
(74) *Attorney, Agent, or Firm* — Oblon, McClelland, Maier & Neustadt, L.L.P.

(57) ABSTRACT

A display device includes: a flexible display including a flexible substrate and a plurality of light emitting elements provided on the flexible substrate; an adhesive layer; and a film attached to the flexible display with the adhesive layer. The adhesive layer is provided avoiding a plurality of blank areas linearly arranged in at least one direction on a surface of the flexible display.

10 Claims, 16 Drawing Sheets

DISPLAY DEVICE

CROSS-REFERENCE TO RELATED APPLICATION

The present application claims priority from Japanese application JP2016-213476 filed on Oct. 31, 2016, the content of which is hereby incorporated by reference into this application.

BACKGROUND OF THE INVENTION

1. Field of the Invention

The present invention relates to a display device.

2. Description of the Related Art

In recent years, the development of a sheet-like display using alight emitter such as an organic light emitting diode (OLED) and capable of being bent has progressed (JP 2011-227369 A). A film is attached to the display for reinforcement.

The flattening of the display becomes easy by attaching the film. On the other hand, the stress of the film exerts influence on the display when the display is bent.

SUMMARY OF THE INVENTION

It is an object of the invention to reduce the influence of stress occurring in a film.

A display device according to an aspect of the invention includes: a flexible display including a flexible substrate and a plurality of light emitting elements provided on the flexible substrate; an adhesive layer; and a film attached to the flexible display with the adhesive layer, wherein the adhesive layer is provided avoiding a plurality of blank areas linearly arranged in at least one direction on a surface of the flexible display.

According to the aspect of the invention, since the adhesive layer is provided avoiding the blank areas, stress occurring in the film is not transmitted in the blank areas when the display device is bent around an axis parallel to the direction in which the plurality of blank areas are linearly arranged. With this configuration, the influence of stress occurring in the film can be reduced.

DETAILED DESCRIPTION OF THE INVENTION

Figure 1:
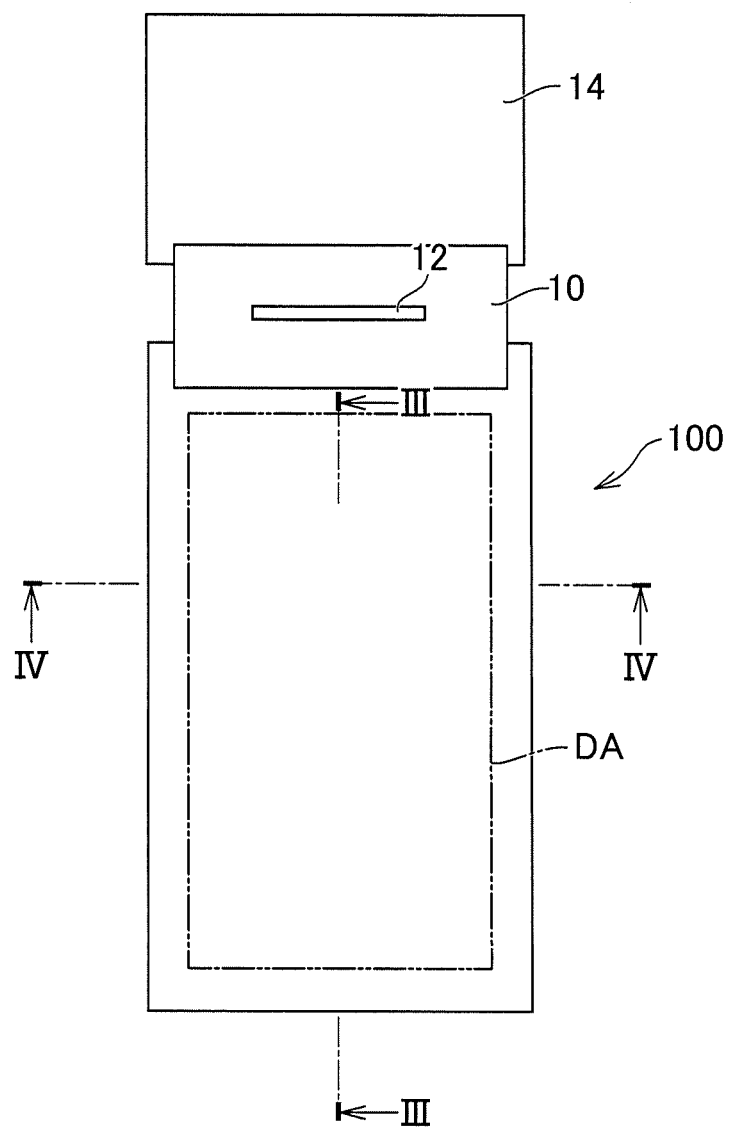
FIG. 1 is a plan view of a display device according to a first embodiment of the invention.

Hereinafter, embodiments of the invention will be described with reference to the drawings. However, the invention can be implemented in various aspects within the scope not departing from the gist thereof, and should not be interpreted as being limited to the details described in the following exemplary embodiments.

In the drawings, the width, thickness, shape, and the like of each part maybe schematically represented, compared to those in practicing aspects of the invention, for more clarity of description. However, they are illustrative only and do not limit the interpretation of the invention. In the specification and the drawings, elements having functions similar to those described in relation to a previous drawing are denoted by the same reference numerals and signs, and a redundant description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

[First Embodiment]

FIG. 1 is a plan view of a display device according to a first embodiment of the invention. As the display device 100, an organic electroluminescent display device is exemplified. The display device 100 is configured such that, for example, a plurality of pixels (sub-pixels) of red, green, and blue are combined to display a full-color image. The display device 100 includes a display area DA where the plurality of pixels are disposed in a matrix. A first flexible printed board 10 is connected to the display device 100 for electrical connection to the outside. An integrated circuit chip 12 for driving elements for displaying an image is mounted on the first flexible printed board 10. A second flexible printed board 14 is connected to the first flexible printed board 10.

Figure 2:
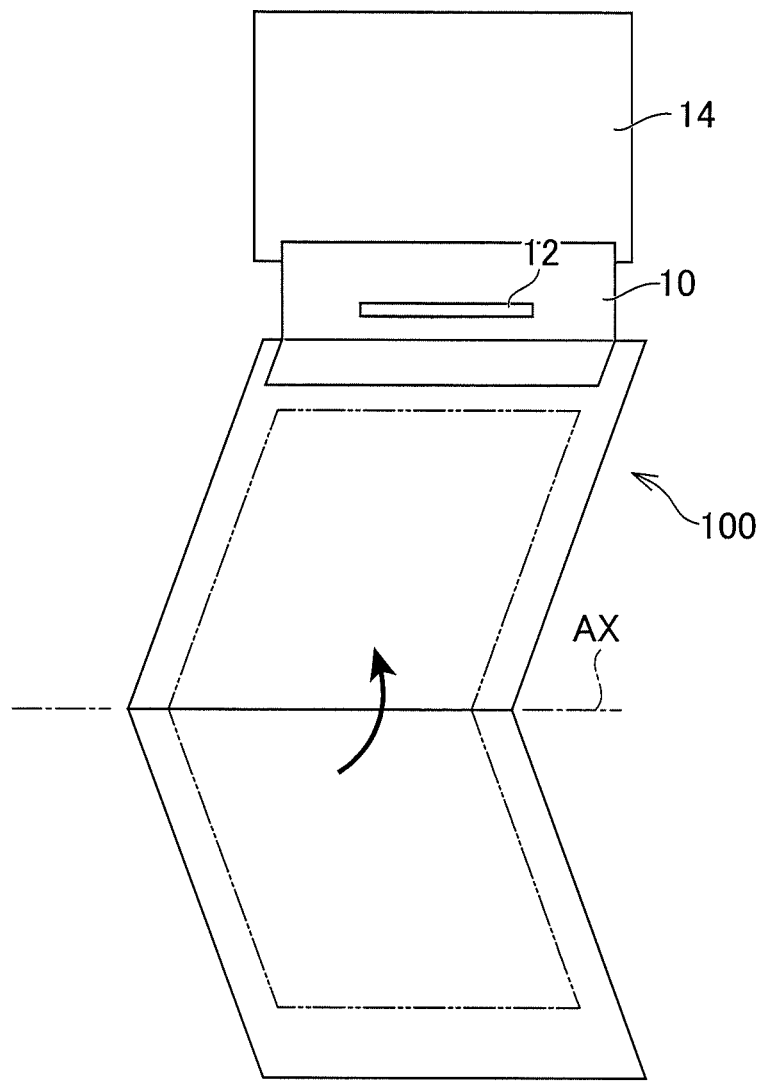
FIG. 2 is a diagram showing the use state of the display device shown in FIG. 1.

FIG. 2 is a diagram showing the use state of the display device shown in FIG. 1. The display device 100 can be folded in the display area DA for portable use. In this example, the display surface becomes concave by folding. The structure therefor will be described below.

Figure 3:
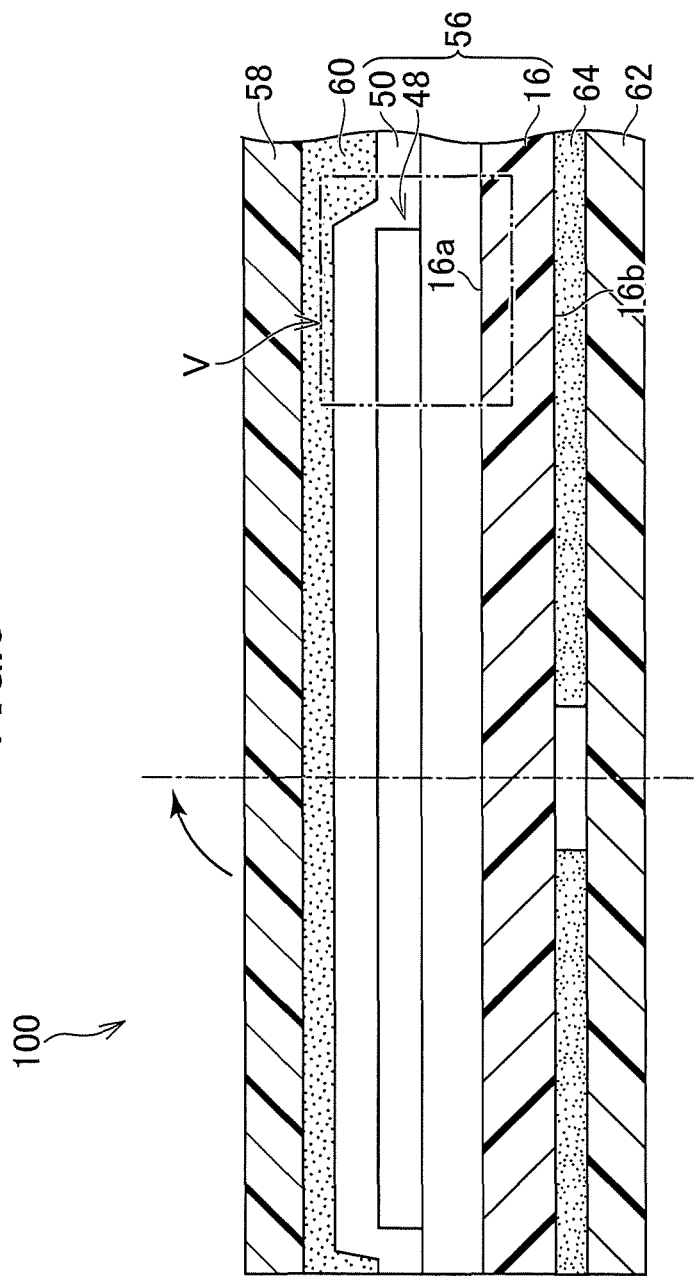
FIG. 3 is a diagram of a cross-section of the display device taken along line shown in FIG. 1, with an increased vertical magnification.
Figure 4:
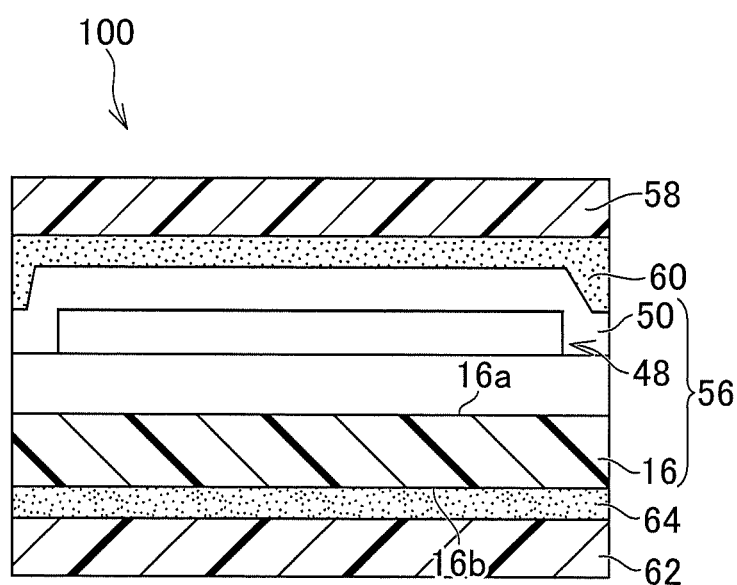
FIG. 4 is a diagram of a cross-section of the display device taken along line IV-IV shown in FIG. 1, with an increased vertical magnification.
Figure 5:
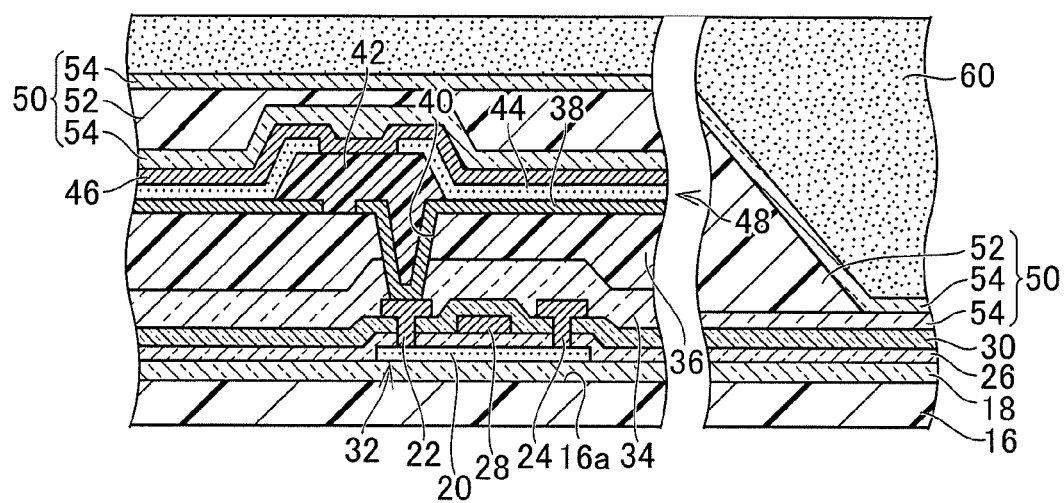
FIG. 5 is an enlarged view of a portion indicated by V in FIG. 3.

FIG. 3 is a diagram of a cross-section of the display device taken along line III-III shown in FIG. 1, with an increased vertical magnification. FIG. 4 is a diagram of a cross-section of the display device taken along line IV-IV shown in FIG. 1, with an increased vertical magnification. FIG. 5 is an enlarged view of a portion indicated by V in FIG. 3.

As shown in FIG. 5, the display device 100 includes a flexible substrate 16. The flexible substrate 16 has, for example, an external shape of a rectangle. The flexible substrate 16 includes a first surface 16a and a second surface 16b. The flexible substrate 16 is formed of polyimide resin, polyethylene terephthalate, or the like. An undercoat layer 18 serving as a barrier to impurities contained in the flexible substrate 16 itself is formed on the flexible substrate 16. The undercoat layer 18 is formed of a silicon oxide film, a silicon nitride film, or the like, and may be a stacked structure of these films. A semiconductor layer 20 is formed on the undercoat layer 18. A source electrode 22 and a drain electrode 24 are electrically connected to the semiconductor layer 20, and a gate insulating film 26 is formed to cover the semiconductor layer 20. A gate electrode 28 is formed on the gate insulating film 26, and an inter-layer insulating film 30 is formed to cover the gate electrode 28. The source electrode 22 and the drain electrode 24 penetrate the gate insulating film 26 and the inter-layer insulating film 30. At least the semiconductor layer 20, the source electrode 22, the drain electrode 24, and the gate electrode 28 constitute a thin film transistor 32. A passivation film 34 is provided so as to cover the thin film transistor 32.

A planarization layer 36 is provided on the passivation film 34. A plurality of lower electrodes 38 (pixel electrodes or anodes) are provided on the planarization layer 36 so as to respectively correspond to the plurality of pixels (sub-pixels). The planarization layer 36 is formed such that at least the surface on which the lower electrode 38 is provided is flat. As the planarization layer 36, an organic material such as photosensitive acrylic resin is used in many cases. The lower electrode 38 is electrically connected to one of the source electrode 22 and the drain electrode 24 on the semiconductor layer 20 through a contact hole 40 penetrating the planarization layer 36 and the passivation film 34.

An insulating layer 42 is formed on the planarization layer 36 and the lower electrode 38. The insulating layer 42 is formed so as to lie on the peripheral edge portion of the lower electrode 38 and open a portion (e.g., a central portion) of the lower electrode 38. The insulating layer 42 forms a bank surrounding a portion of the lower electrode 38.

A light emitting layer 44 is provided on the lower electrode 38. The light emitting layer 44 is provided individually (separately) for each of the lower electrodes 38, and emits blue, red, or green light corresponding to each of the pixels. The colors corresponding to the pixels are not limited to them, and, for example, yellow, white, or the like may be added thereto. The light emitting layer 44 is formed by, for example, vapor deposition.
Alternatively, the light emitting layer 44 may be formed so as to extend over the plurality of pixels on the entire surface covering the display area DA shown in FIG. 1. That is, the light emitting layer 44 may be formed so as to be continuous on the insulating layer 42. In this case, the light emitting layer 44 is formed by application by solvent dispersion. When the light emitting layer 44 is formed so as to extend over the plurality of pixels, the display device is configured such that the light emitting layer 44 emits white light in all of the sub-pixels and that a desired color wavelength portion is extracted through a color filter (not shown).

An upper electrode 46 (a common electrode or a cathode) is provided on the light emitting layer 44. The upper electrode 46 lies on the insulating layer 42 serving as a bank. The upper electrode 46 is continuous above the lower electrodes 38 adjacent to each other. The light emitting layer 44 is interposed between the lower electrode 38 and the upper electrode 46, and emits light with a luminance controlled by an electric current flowing therebetween. At least one layer of a hole transport layer and a hole injection layer (both not shown) may be provided between the light emitting layer 44 and the lower electrode 38. At least one layer of an electron transport layer and an electron injection layer (both not shown) may be provided between the light emitting layer 44 and the upper electrode 46. At least the lower electrode 38, the light emitting layer 44, and the upper electrode 46 constitute a light emitting element 48. A plurality of light emitting elements 48 are provided on the side of the first surface 16a of the flexible substrate 16.

A sealing layer 50 covers the plurality of light emitting elements 48. With this configuration, the light emitting element 48 is shielded from moisture. The sealing layer 50 includes an organic film 52. The sealing layer 50 includes an inorganic film 54 made of SiN, SiOx, or the like, and may be a single layer or have a stacked structure. For example, a pair of inorganic films 54 may vertically interpose the organic film 52 made of resin such as acrylic resin, or the like, therebetween, and may vertically overlap and in contact with each other around the organic film 52. A stacked body from at least the flexible substrate 16 to the sealing layer 50 constitutes a flexible display 56 as shown in FIGS. 3 and 4. The flexible display 56 includes the flexible substrate 16, the plurality of light emitting elements 48, and the sealing layer 50.

As shown in FIGS. 3 and 4, a cover film 58 is attached to the flexible display 56 for reinforcement. The cover film 58 is provided on the side of the first surface 16a on which the plurality of light emitting elements 48 are provided. The cover film 58 is transparent so as to enable the display of an image. The attachment of the cover film 58 is made using a cover adhesive layer 60. The cover adhesive layer 60 adheres to the sealing layer 50 and adheres to the cover film 58. The cover film 58 also serves as protection for the sealing layer 50.

A film 62 is attached to the flexible display 56. The film 62 is provided on the side of the second surface 16b opposite to the first surface 16a on which the plurality of light emitting elements 48 are provided. The attachment of the film 62 is made using an adhesive layer 64. Specifically, the adhesive layer 64 adheres to the flexible substrate 16 and adheres to the film 62.

Figure 6:
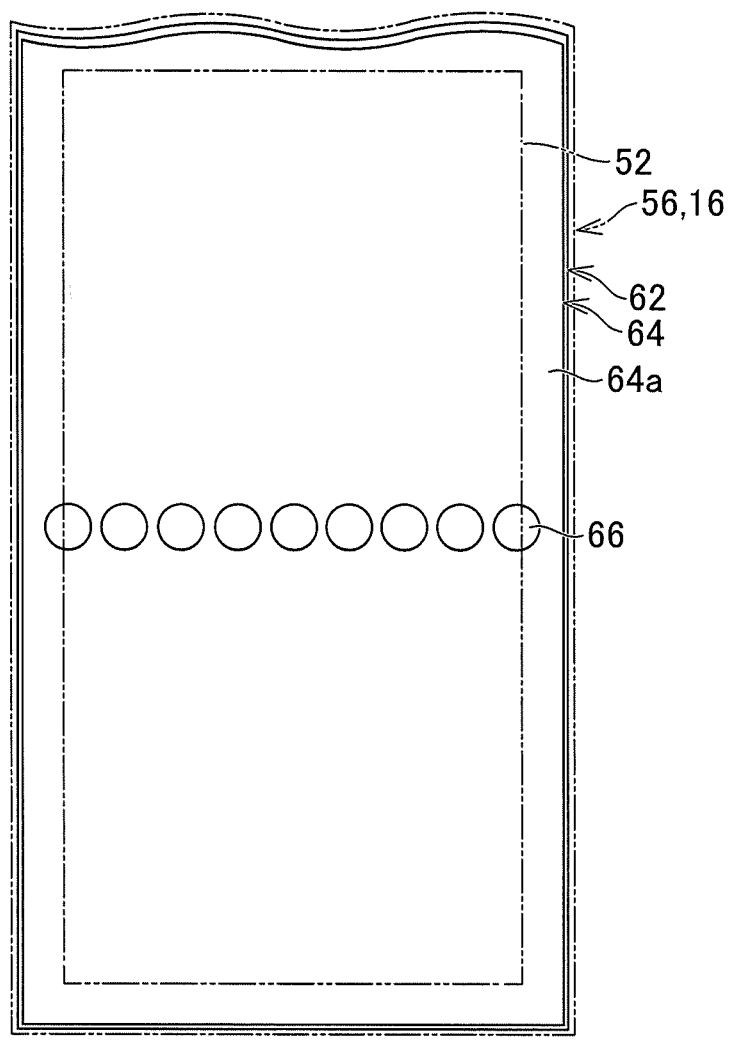
FIG. 6 is a plan view of an adhesive layer and a film in the first embodiment.

FIG. 6 is a plan view of the adhesive layer and the film in the first embodiment. The adhesive layer 64 is provided avoiding blank areas 66. The plurality of blank areas 66 are linearly arranged in at least one direction with respect to the surface of the flexible display 56 (the flexible substrate 16 as a portion thereof). The direction is a direction along the short side of the rectangle as the external shape of the flexible substrate 16. The adhesive layer 64 includes a peripheral edge portion 64a along the external shape of the film 62. The peripheral edge portion 64a is a portion that surrounds the whole of the blank areas 66. As shown in FIG. 6, the adhesive layer 64 is provided so as to project from an area overlapping the organic film 52 (see FIG. 5) of the sealing layer 50. The blank area 66 is located at a position overlapping the organic film 52, and is formed up to a position projecting from the organic film 52.

Compared to the adhesive layer 64, the cover adhesive layer 60 (see FIG. 3) described above does not include the blank area. In FIG. 3, the direction of folding shown in FIG. 2 is shown by the arrow, and the cover adhesive layer 60 is located on the side on which a concave is formed by folding. In contrast to this, the blank areas 66 are formed in the adhesive layer 64 located on the side (outer circumferential side of folding) on which a convex is formed by folding.

According to the embodiment, since the adhesive layer 64 is provided avoiding the blank areas 66, stress occurring in the film 62 is not transmitted in the blank areas 66 when the display device 100 is bent, as shown in FIG. 2 or 3, around an axis AX (see FIG. 2) parallel to the direction in which the plurality of blank areas 66 are linearly arranged. With this configuration, the influence of stress occurring in the film 62 can be reduced.

[Second Embodiment]

Figure 7:
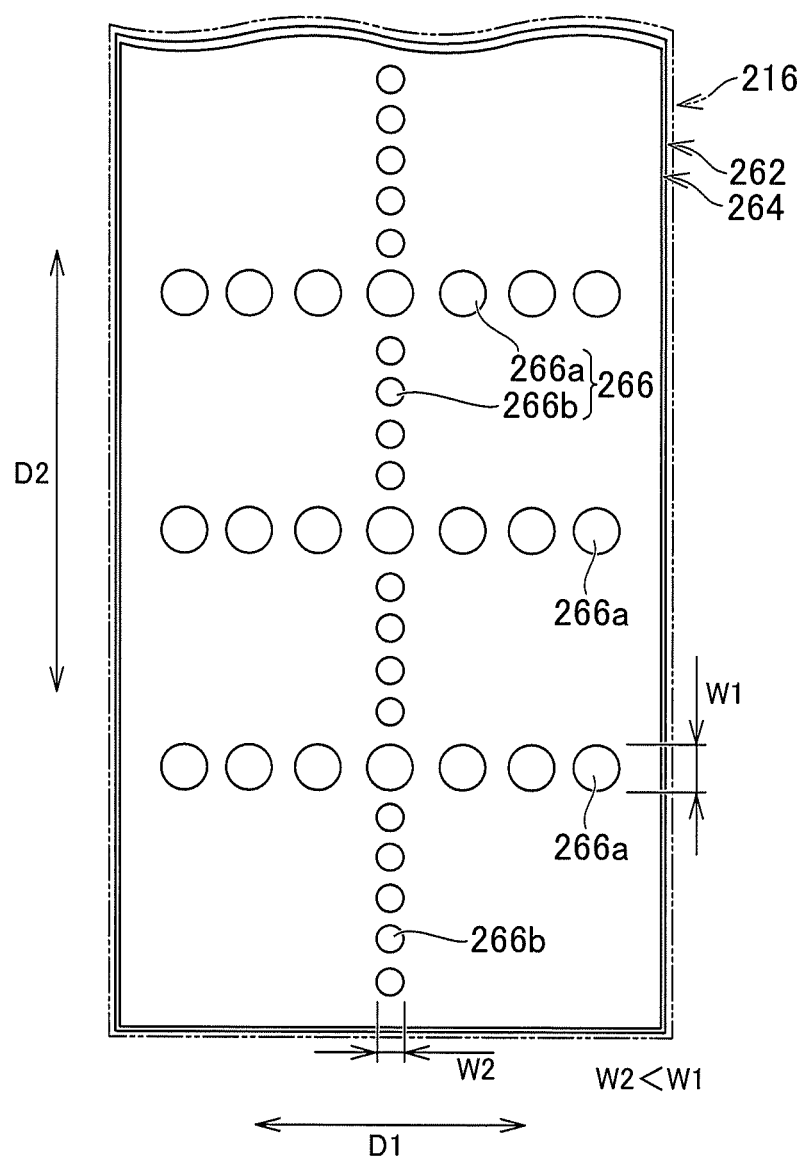
FIG. 7 is a plan view of an adhesive layer and a film of a display device according to a second embodiment of the invention.

FIG. 7 is a plan view showing an adhesive layer and a film of a display device according to a second embodiment of the invention. A flexible substrate 216 has an external shape of a rectangle. A first direction D1 is a direction along the short side of the rectangle. A second direction D2 is a direction along the long side of the rectangle. The adhesive layer 264 is provided avoiding blank areas 266 and adheres to the flexible substrate 216 and the film 262.

The plurality of blank areas 266 include a plurality of first portions 266a (e.g., a plurality of first portions 266a) arranged in the first direction D1. The plurality of blank areas 266 include a plurality of second portions 266b (e.g., one second portion 266b) arranged in the second direction D2 crossing (in this example, orthogonal to) the first direction D1. The width of the first portion 266a and the width of the second portion 266b are different in size. For example, the width W1 of the first portion 266a is larger than the width W2 of the second portion 266b. The details described in the first embodiment apply to other details of the second embodiment.

[Third Embodiment]

Figure 8:
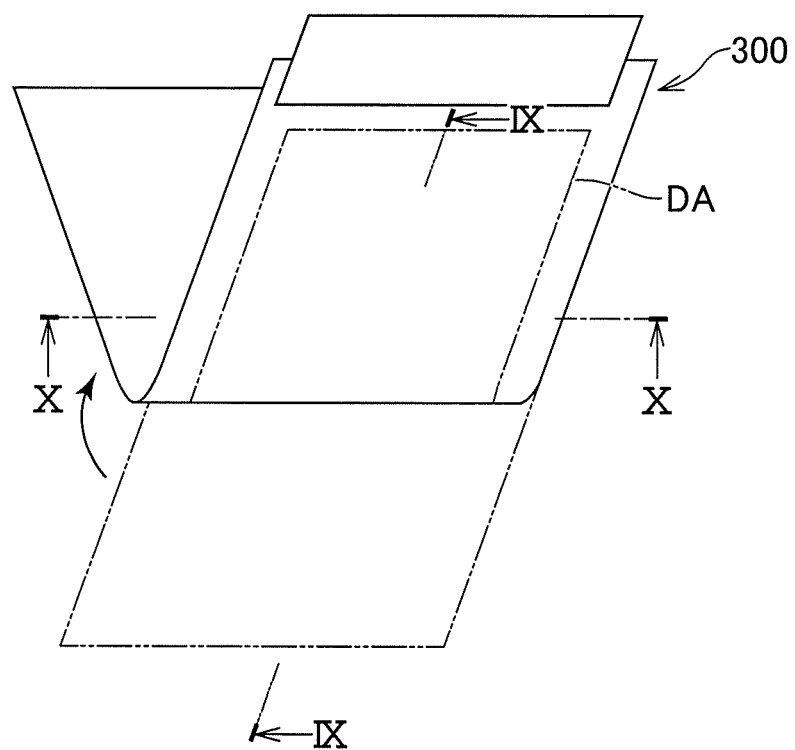
FIG. 8 is a perspective view showing the use state of a display device according to a third embodiment of the invention.

FIG. 8 is a perspective view showing the use state of a display device according to a third embodiment of the invention. In this example, it is assumed that the display device 300 is folded such that the display surface of the display area DA becomes convex.

Figure 9:
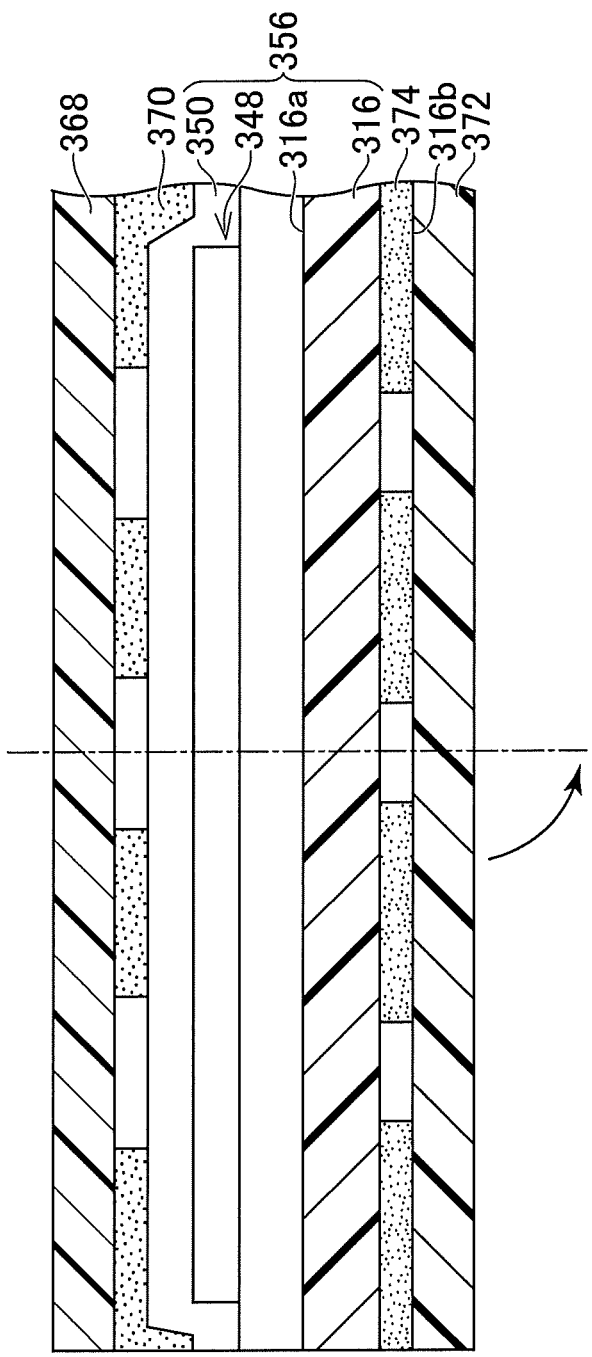
FIG. 9 is a diagram of a cross-section of the display device taken along line IX-IX shown in FIG. 8, with an increased vertical magnification.
Figure 10:
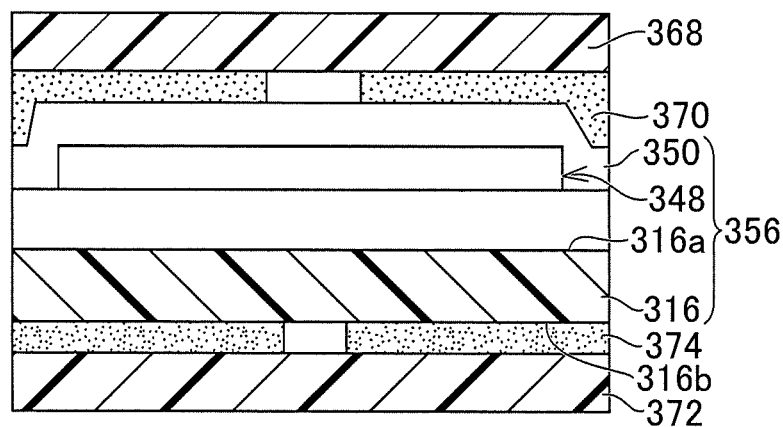
FIG. 10 is a diagram of a cross-section of the display device taken along line X-X shown in FIG. 8, with an increased vertical magnification.

FIG. 9 is a diagram of a cross-section of the display device taken along line IX-IX shown in FIG. 8, with an increased vertical magnification. FIG. 10 is a diagram of a cross-section of the display device taken along line X-X shown in FIG. 8, with an increased vertical magnification.

A flexible substrate 316 includes a first surface 316a and a second surface 316b. A plurality of light emitting elements 348 are provided on the side of the first surface 316a of the flexible substrate 316. A first film 368 is provided on the side of the first surface 316a. The first film 368 is attached with a first adhesive layer 370. Specifically, the first adhesive layer 370 adheres to a sealing layer 350 and the first film 368. A second film 372 is provided on the side of the second surface 316b. The second film 372 is attached with a second adhesive layer 374. Specifically, the second adhesive layer 374 adheres to the flexible substrate 316 and the second film 372.

Figure 11:
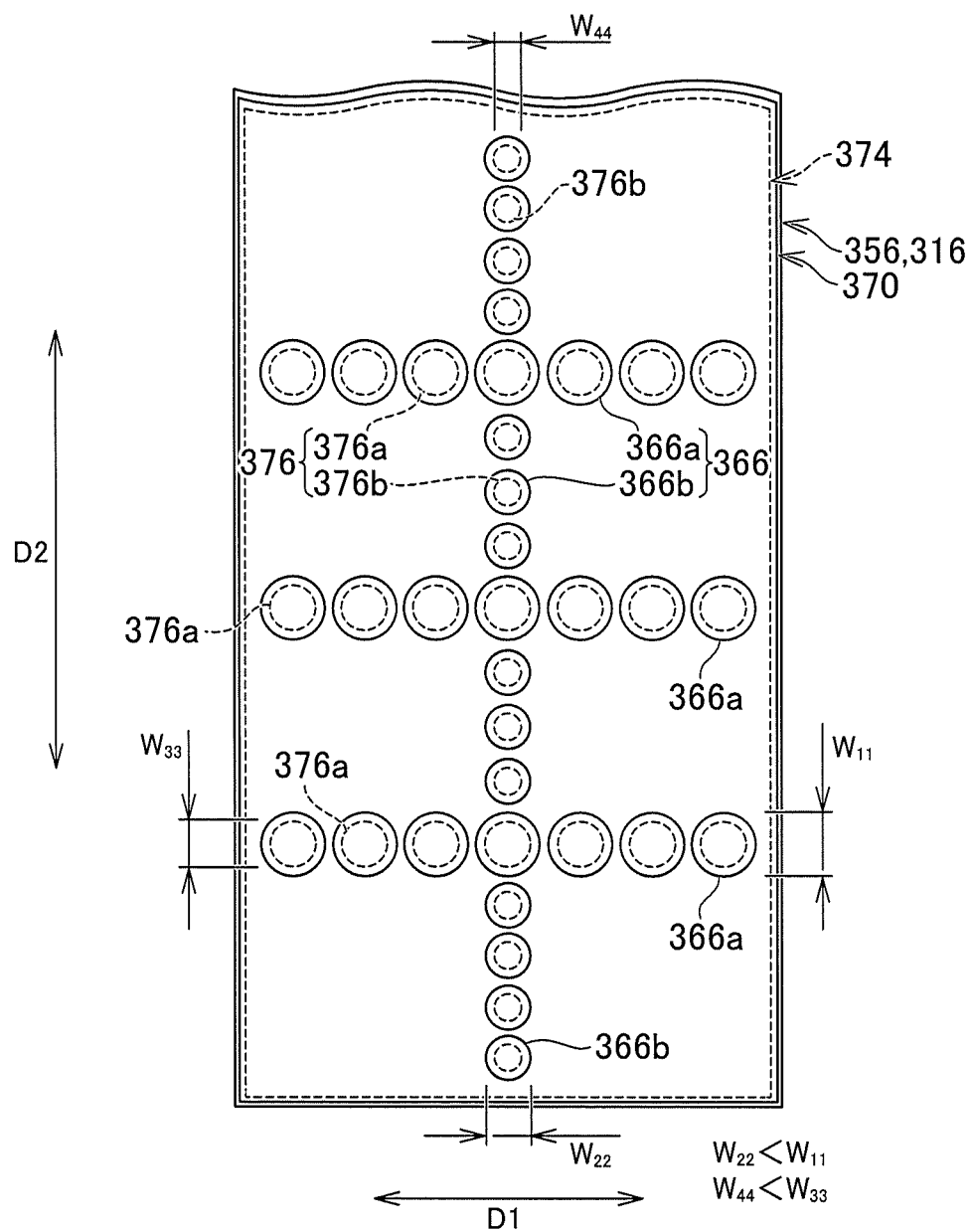
FIG. 11 is a plan view of a first adhesive layer and a second adhesive layer in the third embodiment.

FIG. 11 is a plan view of the first adhesive layer and the second adhesive layer in the third embodiment. A flexible display 356 including the flexible substrate 316 intervenes between the first adhesive layer 370 and the second adhesive layer 374.

The first adhesive layer 370 is provided avoiding first blank areas 366. The plurality of first blank areas 366 include a plurality of first portions 366a (e.g., a plurality of first portions 366a) arranged in the first direction D1. The plurality of first blank areas 366 include a plurality of second portions 366b (e.g., one second portion 366b) arranged in the second direction D2 crossing (in this example, orthogonal to) the first direction D1. The width of the first portion 366a and the width of the second portion 366b are different in size. For example, the width W11 of the first portion 366a is larger than the width W22 of the second portion 366b.

The second adhesive layer 374 is provided avoiding second blank areas 376. The plurality of second blank areas 376 include a plurality of third portions 376a (e.g., a plurality of third portions 376a) arranged in the first direction D1. The plurality of second blank areas 376 include a plurality of fourth portions 376b (e.g., one fourth portion 376b) arranged in the second direction D2. The width of the third portion 376a and the width of the fourth portion 376b are different in size. For example, the width W33 of the third portion 376a is larger than the width W44 of the fourth portion 376b.

The first blank area 366 and the second blank area 376 at least partially overlap. A group of at least a portion of the plurality of first blank areas 366 and a group of at least a portion of the plurality of second blank areas 376 overlap each other and are arranged in the same direction. For example, the plurality of first portions 366a and the plurality of third portions 376a overlap each other and are arranged in the first direction D1. The plurality of second portions 366b and the plurality of fourth portions 376b overlap each other and are arranged in the second direction D2.

The width of the group of at least a portion of the plurality of first blank areas 366 and the width of the group of at least a portion of the plurality of second blank areas 376 are different in size. The width of the group of at least a portion of the plurality of first blank areas 366 is larger than the width of the group of at least a portion of the plurality of second blank areas 376. For example, the width W11 of the first portion 366a is larger than the width W33 of the third portion 376a. The width W22 of the second portion 366b is larger than the width W44 of the fourth portion 376b. The details described in the first and second embodiments apply to other details of the third embodiment.

[Fourth Embodiment]

Figure 12:
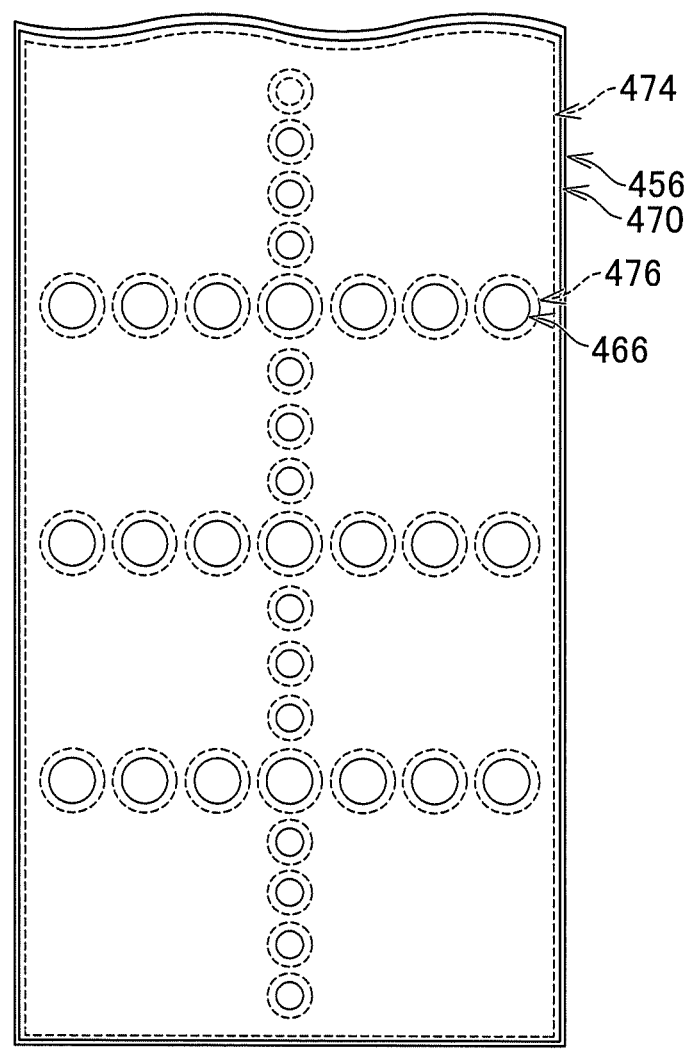
FIG. 12 is a plan view of a first adhesive layer and a second adhesive layer in a fourth embodiment.

FIG. 12 is a plan view of a first adhesive layer and a second adhesive layer in a fourth embodiment. A flexible display 456 intervenes between the first adhesive layer 470 and the second adhesive layer 474. In this example, the shapes and sizes of first blank areas 466 and second blank areas 476 are reversed from the third embodiment.

According to the embodiment, the width of a group of at least a portion of the plurality of first blank areas 466 is smaller than the width of a group of at least a portion of the plurality of second blank areas 476. For example, the whole of the first blank area 466 is included in the second blank area 476. Hence, the embodiment is suitable when the display device is folded such that the display surface becomes concave, which is reversed from the third embodiment.

[Fifth Embodiment]

Figure 13:
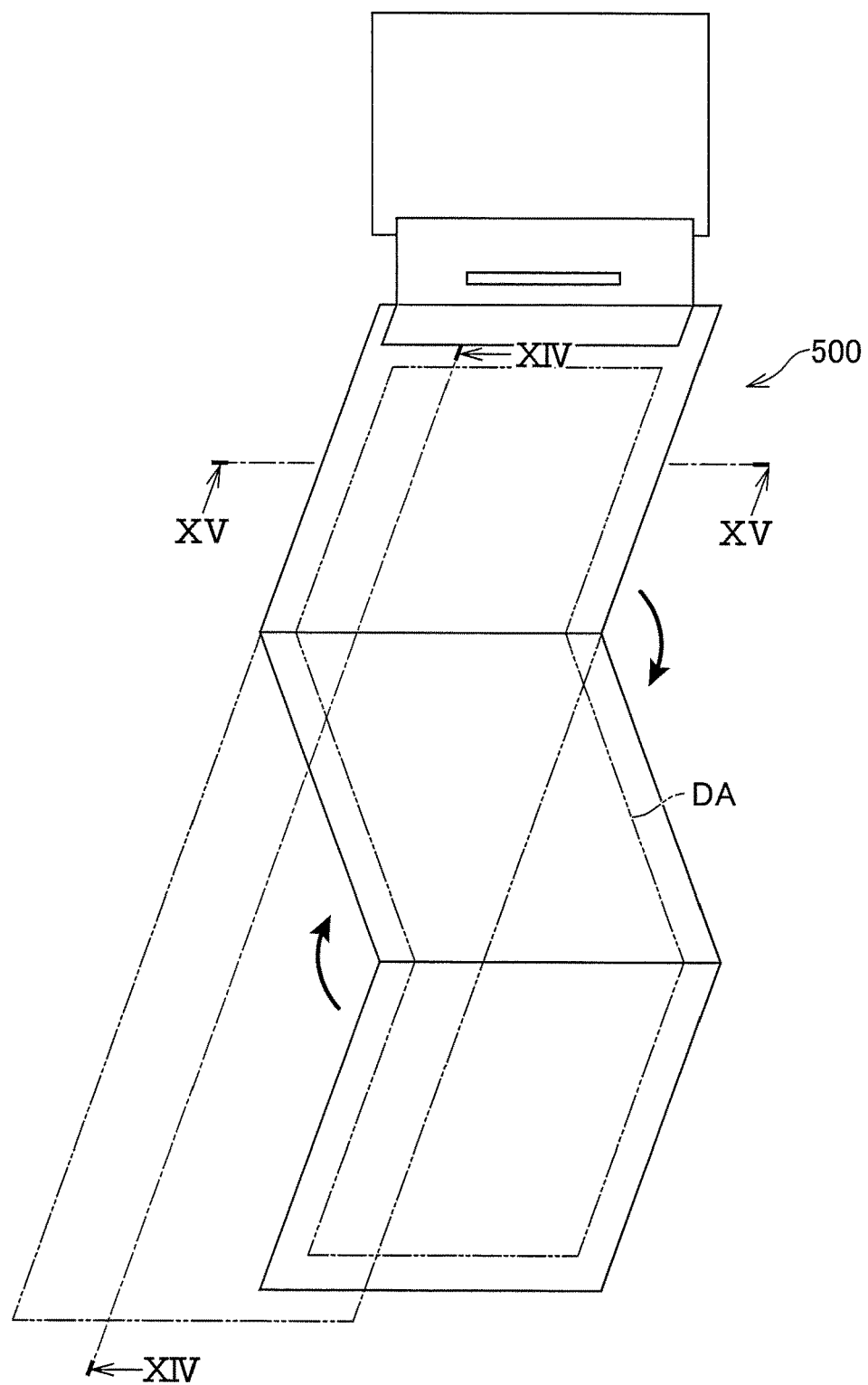
FIG. 13 is a perspective view showing the use state of a display device according to a fifth embodiment of the invention.

FIG. 13 is a perspective view showing the use state of a display device according to a fifth embodiment of the invention. In this example, it is assumed that the display device 500 is folded such that a portion of the display surface of the display area DA becomes convex while another portion thereof becomes concave.

Figure 14:
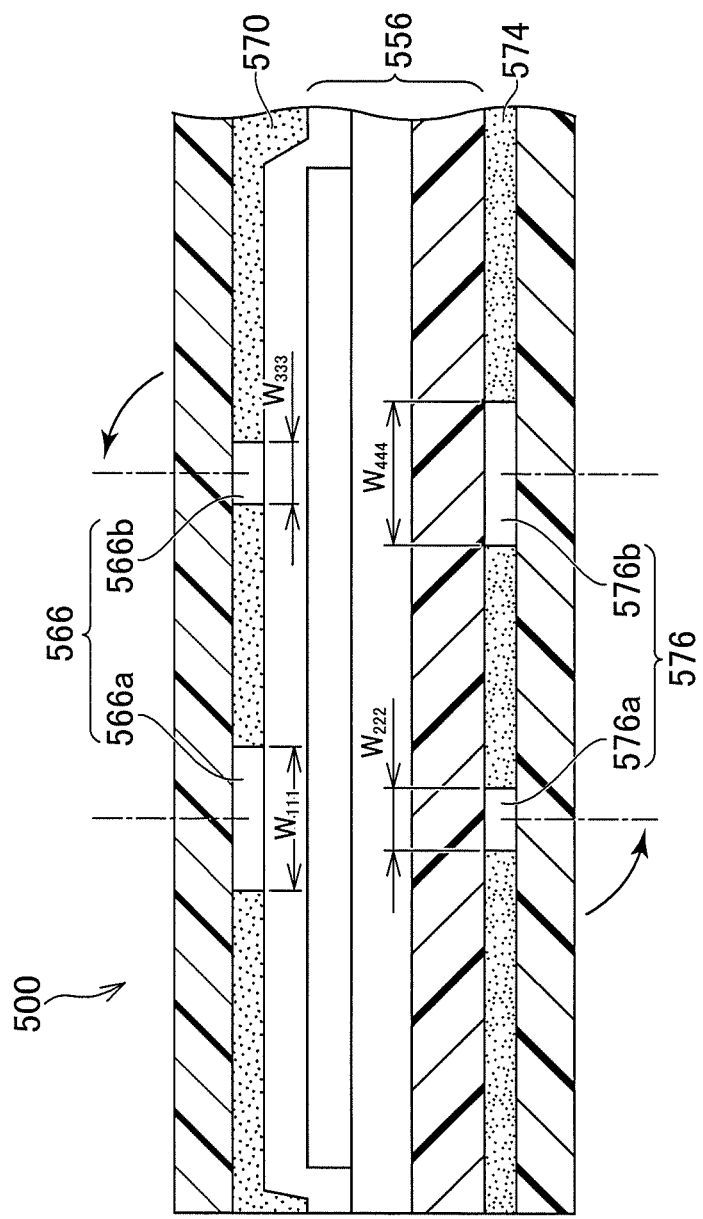
FIG. 14 is a diagram of a cross-section of the display device taken along line XIV-XIV shown in FIG. 13, with an increased vertical magnification.
Figure 15:
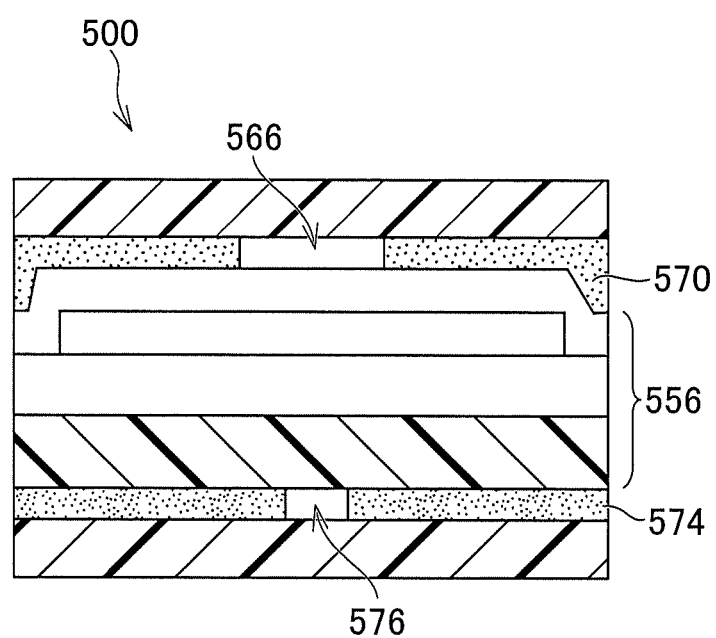
FIG. 15 is a diagram of a cross-section of the display device taken along line XV-XV shown in FIG. 13, with an increased vertical magnification.

FIG. 14 is a diagram of a cross-section of the display device taken along line XIV-XIV shown in FIG. 13, with an increased vertical magnification. FIG. 15 is a diagram of a cross-section of the display device taken along line XV-XV shown in FIG. 13, with an increased vertical magnification. A first adhesive layer 570 is provided avoiding first blank areas 566. A second adhesive layer 574 is provided avoiding second blank areas 576.

Figure 16:
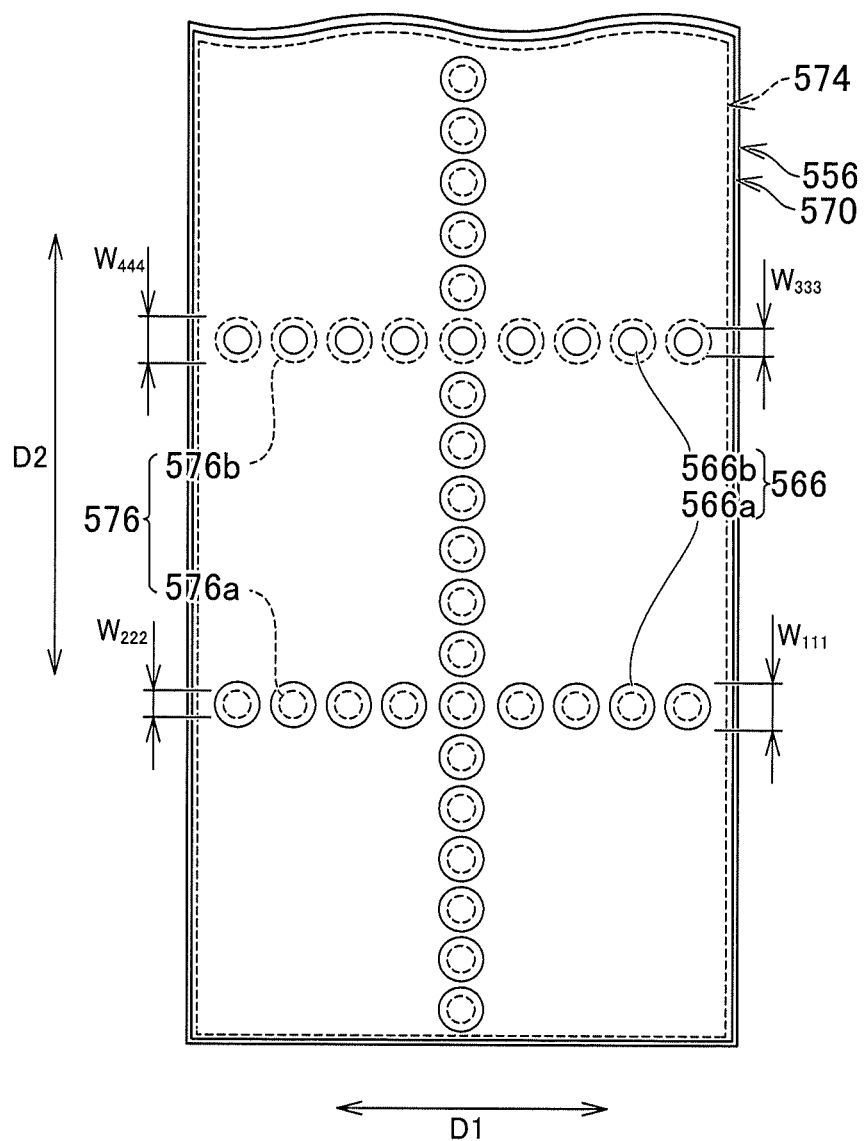
FIG. 16 is a plan view of a first adhesive layer and a second adhesive layer in the fifth embodiment.

FIG. 16 is a plan view of the first adhesive layer and the second adhesive layer in the fifth embodiment. A flexible display 556 intervenes between the first adhesive layer 570 and the second adhesive layer 574.

As shown in FIG. 16, the plurality of first blank areas 566 include a plurality of first areas 566a arranged in the first direction D1. The plurality of second blank areas 576 include a plurality of second areas 576a arranged in the first direction D1. The plurality of first areas 566a of the plurality of first blank areas 566 and the plurality of second areas 576a of the plurality of second blank areas 576 overlap each other and are arranged in the same direction (the first direction D1). The width W111 of the first area 566a is larger than the width W222 of the second area 576a.

In FIG. 14, the display device is folded, at a position where the first area 566a and the second area 576a overlap, such that the side (display surface) on which the first adhesive layer 570 is located becomes convex (see FIG. 13). The width W111 of the first area 566a is larger than the width W222 of the second area 576a so as to be suited for this bend.

As shown in FIG. 16, the plurality of first blank areas 566 include a plurality of third areas 566b arranged in the first direction D1. The plurality of second blank areas 576 include a plurality of fourth areas 576b arranged in the first direction D1. The plurality of third areas 566b of the plurality of first blank areas 566 and the plurality of fourth areas 576b of the plurality of second blank areas 576 overlap each other and are arranged in the same direction (the first direction D1). The width W444 of the fourth area 576b is larger than the width W333 of the third area 566b.

In FIG. 14, the display device is folded, at a position where the third area 566b and the fourth area 576b overlap, such that the side (display surface) on which the first adhesive layer 570 is located becomes concave (see FIG. 13). The width of the fourth area 576b is larger than the width of the third area 566b so as to be suited for this bend. The details described in any of the first to fourth embodiments apply to other details of the fifth embodiment.

The display device is not limited to an organic electroluminescent display device, but may be a display device including a light emitting element such as a quantum-dot light emitting element (quantum-dot light emitting diode (QLED)) in each pixel or a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a flexible display including a flexible substrate and a plurality of light emitting elements provided on the flexible substrate;
an adhesive layer; and
a film attached to the flexible display with the adhesive layer, wherein
the adhesive layer is provided avoiding a plurality of blank areas linearly arranged in at least one direction on a surface of the flexible display,
the adhesive layer includes a peripheral edge portion along an external shape of the film,
the peripheral edge portion surrounds the whole of the plurality of blank areas,
the flexible display further includes a sealing layer covering the plurality of light emitting elements,
the sealing layer includes an organic film and a pair of inorganic films vertically interposing the organic film therebetween and vertically overlapping and in contact with each other around the organic film,
the adhesive layer is provided to project from an area overlapping the organic film, and
the plurality of blank areas are located at positions overlapping the organic film.

2. The display device according to claim 1, wherein
the plurality of blank areas include a plurality of first portions arranged in a first direction and a plurality of second portions arranged in a second direction crossing the first direction.

3. The display device according to claim 2, wherein
a width of the plurality of first portions and a width of the plurality of second portions are different in size.

4. The display device according to claim 3, wherein
the flexible substrate has an external shape of a rectangle,
the first direction is a direction along a short side of the rectangle,
the second direction is a direction along a long side of the rectangle, and
the width of the plurality of first portions is larger than the width of the plurality of second portions.

5. The display device according to claim 1, wherein
the flexible substrate includes a first surface and a second surface,
the film includes a first film provided on a side of the first surface and a second film provided on a side of the second surface,
the adhesive layer includes a first adhesive layer for attaching the first film and a second adhesive layer for attaching the second film, and
the plurality of blank areas include a plurality of first blank areas that the first adhesive layer avoids and a plurality of second blank areas that the second adhesive layer avoids.

6. The display device according to claim 5, wherein
the plurality of first blank areas and the plurality of second blank areas at least partially overlap.

7. The display device according to claim 6, wherein
a group of at least a portion of the plurality of first blank areas and a group of at least a portion of the plurality of second blank areas overlap each other and are arranged in the same direction, and
a width of the group of the at least a portion of the plurality of first blank areas and a width of the group of the at least a portion of the plurality of second blank areas are different in size.

8. The display device according to claim 7, wherein
the plurality of light emitting elements are provided on the side of the first surface of the flexible substrate, and
the width of the group of the at least a portion of the plurality of first blank areas is larger than the width of the group of the at least a portion of the plurality of second blank areas.

9. The display device according to claim 7, wherein
the plurality of light emitting elements are provided on the side of the first surface of the flexible substrate, and the width of the group of the at least a portion of the plurality of first blank areas is smaller than the width of the group of the at least a portion of the plurality of second blank areas.

10. The display device according to claim 6, wherein first areas of the plurality of first blank areas and second areas of the plurality of second blank areas overlap each other and are arranged in the same direction, third areas of the plurality of first blank areas and fourth areas of the plurality of second blank areas overlap each other and are arranged in the same direction, a width of the first area is larger than a width of the second area, and a width of the fourth area is larger than a width of the third area.

* * * * *